United States Patent [19]

Shiga

[11] Patent Number: 4,963,871
[45] Date of Patent: Oct. 16, 1990

[54] ANALOG-TO-DIGITAL CONVERTER USING SUPERCONDUCTING MATERIAL

[75] Inventor: Nobuo Shiga, Kanagawa, Japan

[73] Assignee: Sumitomo Electric Industries, Ltd., Osaka, Japan

[21] Appl. No.: 235,940

[22] Filed: Aug. 24, 1988

[30] Foreign Application Priority Data

Aug. 25, 1987 [JP] Japan .................................. 62-210708
Aug. 25, 1987 [JP] Japan .................................. 62-210709
Aug. 25, 1987 [JP] Japan .................................. 62-210710

[51] Int. Cl.$^5$ .......................................... H03M 1/12
[52] U.S. Cl. ....................................... 341/133; 341/171
[58] Field of Search ....................... 341/133, 155, 171; 357/5

[56] References Cited

U.S. PATENT DOCUMENTS 3,419,712 12/1968 Green ................................. 341/171
3,458,735 7/1969 Fiske ................................. 341/171

Primary Examiner—William M. Shoop, Jr.
Assistant Examiner—Marc S. Hoff
Attorney, Agent, or Firm—Cushman, Darby & Cushman

[57] ABSTRACT

An analog-to-digital converter using superconducting material. The converter includes a converter portion having a plurality of series-connected superconducting current channels for which different values of a certain critical condition are set, the values differing from one another by a fixed amount. The converter also includes a detector portion including means for detecting the interruption of the flow of a superconducting current in each of said superconducting current channels, the analog-to-digital converter outputting a digital signal indicative of the associated change in a physical quantity related to said critical condition and which is applied as an input to the converter portion.

15 Claims, 2 Drawing Sheets

ANALOG-TO-DIGITAL CONVERTER USING SUPERCONDUCTING MATERIAL

BACKGROUND OF THE INVENTION

1. Field of the Invention

The present invention relates in general to analog-to-digital converters. More particularly, the invention is directed to the structure of an analog-to-digital converter utilizing a superconductor.

2. Description of the Prior Art

When a certain material is in the superconducting state, it becomes totally diamagnetic and will not develop a potential difference across it even though a finite amount of steady current flows through it.

This phenomenon of superconductivity has the potential to be used in a very broad range of applications including power generation by magnetohydrodynamics (MHD), power transmission, power storage, magnetic levitational trains, electromagnetically propelled ships, as well as very sensitive measurements of magnetic fields, high frequency, radiation, etc. in such instrumentation fields as nuclear magnetic resonance (NMR), pionic therapy and laboratory equipment used in high-energy physics. Another potential application of superconductivity is in electronic devices of the type including Josephson junction elements which are anticipated to realize circuits that consume less power and operate at faster speeds than conventional devices.

Superconductivity has so far been observed only at cryogenic temperatures. Even $Nb_3Ge$ which is the superconducting material having the highest superconducting transition temperature Tc does not exhibit superconductivity unless the temperature is below 23.2 K. In order to bring about superconductivity, it has been required to cool the superconductor material to its Tc using liquid helium having a boil point of 4.2 K. However, the use of liquid helium is technically difficult and is very expensive because of the need to employ large cooling facilities including liquefying equipment. This has been a great obstacle in commercializing the potential applications of superconductivity.

Quite recently, it has been reported that sintered composite oxides are superconductors that are capable of exhibiting superconductivity at higher critical temperatures. This discovery has triggered active research efforts to commercialize technology of superconductivity using non-cryogenic superconductors. While various composite oxides have been reported as promising non-cryogenic superconductors, those which are based on Y-Ba-Cu, La-Ba-Cu, or La-Sr-Cu systems and which have crystallographic structures similar to perovskite are particularly interesting since they make the transition to a superconducting state at the temperature of liquid nitrogen and higher.

These new superconducting materials make it possible to exploit the phenomenon of superconductivity under conditions that are closer to those of the natural environment. In order to tap this potential, active research work is underway in many fields of industry and some scientists even predict that the technology of superconductivity is one of the last major breakthroughs to be made in this century which will have dramatic impact on industry.

The present invention has been accomplished as a result of intensive studies made by the present inventors in order to find an effective way of utilizing the recently reported new superconducting materials. It provides a novel analog-to-digital converter as a device that exploits the potential of these superconducting materials.

SUMMARY OF THE INVENTION

It is accordingly an object of the present invention to provide an analog-to-digital converter that employs a superconducting material having a high superconducting transition temperature and which is capable of very fast operation even under conditions that are relatively close to those of the natural environment.

Another object of the present invention is to provide an analog-to-digital converter that can be fabricated through very simple steps by forming a plurality of Josephson junctions of a superconducting material having a high superconducting transition temperature and which is capable of very fast operation even under conditions that are relatively close to those of the natural environment.

The analog-to-digital converter according to the present invention comprises a plurality of series-connected superconducting current channels for which different values of a certain critical condition are set, the values differing from one another by a fixed amount. A detector portion is furnished with means for detecting the interruption of the flow of superconducting current in each of the superconducting current channels The analog-to-digital converter detects either a change in current on which is superposed an analog signal applied to the converter portion or a change in magnetic field on which the analog signal is superposed. The analog-to-digital converter outputs a digital signal in response to the detected change.

Advantageously, each of the superconducting current channels in this analog-to-digital converter is formed of a composite oxide superconducting material represented by the following general formula:

$$(\alpha 1-x \beta x)y y \delta z$$

where $\alpha$ denotes an element of Group IIa of the periodic table; $\beta$ denotes an element of Groups IIIa of the periodic table; $\gamma$ denotes an element of Group Ib, IIb, IIIb, IVa or VIIIa of the periodic table; $\delta$ denotes oxygen; and x, y and z satisfy the relations: $X=0.1-0.9$, $y=1.0-4.0$, and $1 \leq z \leq 5$.

Particularly advantageous combinations of elements include Ba-Y-Cu, Ba-La-Cu and Sr-La-Cu systems, and composite oxides of these combinations of elements exhibit superconductivity at temperatures above the temperature of liquid helium, so superconducting circuits fabricated from these composite oxides hold much promise for use in commercial applications.

DETAILED DESCRIPTION OF THE PREFERRED EMBODIMENTS

Figure 1:
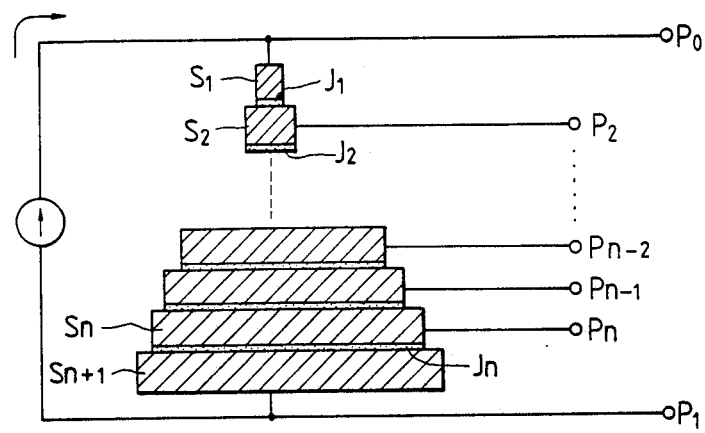
FIG. 1 shows schematically the converter portion of an analog-to-digital converter according to the present invention.

The analog-to-digital converter according to the present invention includes a converter portion that comprises a plurality of series-connected superconducting current channels having different values of critical current.

Advantageously, each of the superconducting current channels in the analog-to-digital converter is formed of a composite oxide superconducting material represented by the following general formula:

$$(\alpha 1-x\beta x)\gamma y \delta z$$

where $\alpha$ denotes an element of Group IIa of the periodic table; $\beta$ denotes an element of Group IIIa of the periodic table; $\gamma$ denotes an element of Group Ib, IIb, IIIb, IVa or VIIIa of the period table; $\delta$ denotes oxygen; and x, y and z satisfy the relations: $x = 0.1-0.9$, $y = 1-0.0-4.0$, and $1 \leq z \leq 5$. particularly advantageous combinations of elements include Ba-Y-Cu, Ba-La-Cu and ,.Sr-La-Cu.

Superconducting current channels usually have predetermined values for critical conditions including critical current density, critical magnetic field and critical temperature. In an environment where the values of these critical conditions are below their predetermined levels, the superconducting current channels become entirely resistanceless and no voltage will develop in these channels. In a different environment where the values of these critical conditions exceed their respective predetermined levels, the superconducting state is upset and the superconducting current channels will become either a normal conductor (governed by Ohm's law) or an insulator, depending upon the material of which the channels are formed. Needless to say, a voltage will develop across the superconducting current channels in proportion to the applied current or voltage.

In the converter portion of the analog-to-digital converter of the present invention, a plurality of superconducting current channels having different values of critical current are connected in series Suppose here that a predetermined current smaller than the minimum value of a critical current is flowing through the converter portion. If, under this condition, a change occurs either in the current on which is superimposed an analog signal applied to the converter portion or in a magnetic field (or surrounding magnetic field) on which said analog signal is superimposed, any of the superconducting current channels with a critical condition having a smaller value than the levels corresponding to the resultant change will revert to normal conductors, thereby producing a certain voltage across each of these particular superconducting current channels. Therefore, in accordance with the principles of the present invention, any change in either the current or surrounding magnetic field on which an applied analog signal is superimposed is converted to a digital signal.

The detector portion of the analog-to-digital converter of the present invention may include a circuit capable of detecting the voltage that has developed in the manner described in the preceding paragraph. Therefore, in accordance with the present invention, a plurality of superconducting current channels having different values of a critical condition that vary stepwise by a fixed amount are connected in series and the detected voltage is supplied to an encoder, which outputs a digital signal, for example, a binary signal.

The superconducting current channels may be formed of Josephson junctions so as to enable very rapid device operations. In this case, the superconducting current channels in the converter portion which have different values of a critical condition can be physically controlled by changing such factors as the junction area of each Josephson junction.

For practical purposes, the analog-to-digital converter of the present invention can advantageously be fabricated by forming superconducting thin films on a substrate by physical vapor deposition techniques, such as sputtering and ion plating. In order to form thin films of the perovskite structure that display effective superconducting characteristics, substrates having surface properties with the perovskite or a similar structure are preferably used.

specific examples of such preferable substrates are single-crystal $SrTiO_3$, single-crystal MgO, and sapphire.

In addition to the use of physical vapor deposition techniques, superconducting layers can be formed on a substrate by a wet coating process and subsequently sintered to produce superconducting current channels for use in the analog-to-digital converter of the present invention.

The present invention is described hereinafter in greater detail with reference to the embodiments shown in the accompanying drawings. These embodiments are provided for illustrative purposes only and are by no means intended to limit the technical scope of the present invention.

FIG. 1 shows schematically the converter portion of an analog-to-digital converter that is composed of Josephson junctions in accordance with the present invention. As shown in FIG. 1, this converter portion is composed of superconducting members ..$S_1$, $S_2$, ... $S_n$, ... $S_{n+1}$ in superposition that vary stepwise in their cross-sectional area. A thin insulation layer is interposed between individual superconducting members to form Josephson junctions $J_1, J_2, ... J_n$ having different values of critical current. The two ends of the assembly of these superconducting members are connected to a pair of terminals $P_1$ and $P_O$ through which a current is to be applied to said assembly. The individual superconducting members $S_2, ... S_n$ are connected to voltage detecting terminals $P_2$, $P_3$, ... $P_n$, respectively.

Figure 2:
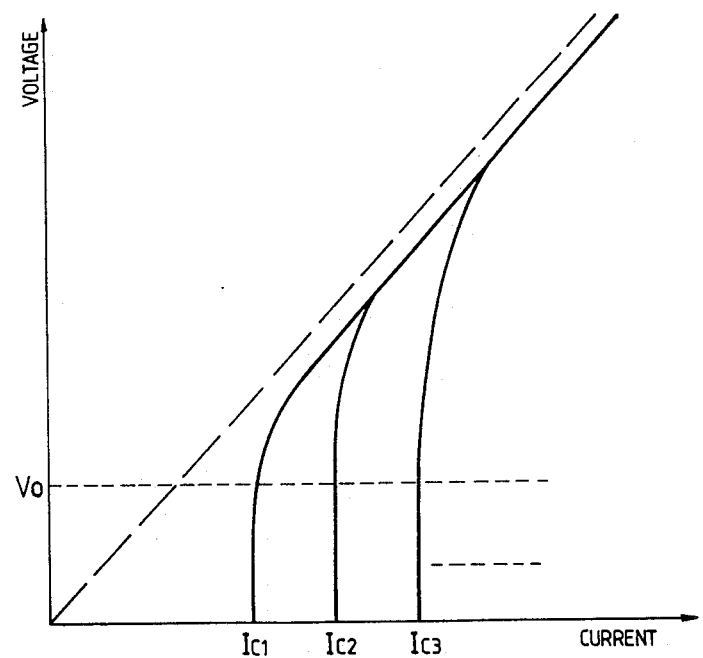
FIG. 2 is a graph showing the voltage developing across several junctions as a function of an input current on an analog signal is superposed.
Figure 3:
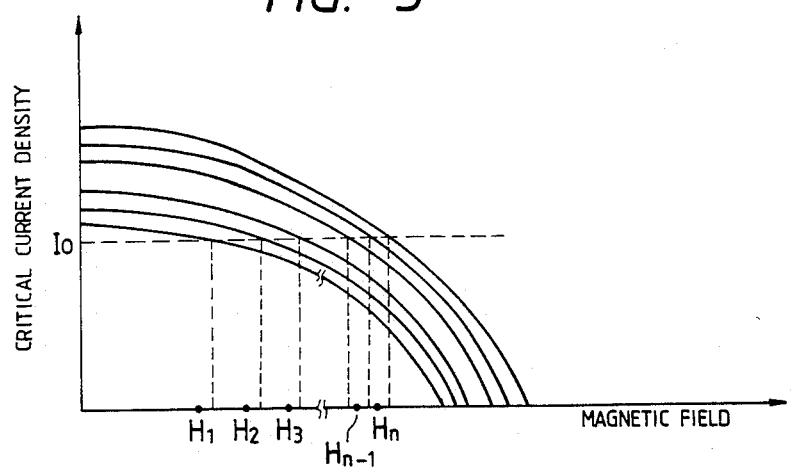
FIG. 3 is a graph showing the critical current density at several Josephson junctions as a function of an input magnetic field on which an analog signal is superposed.

FIG. 2 is a graph showing the voltage that develops across several Josephson junctions as a function of an input current on which an analog signal is superimposed. FIG. 3 is a graph showing the critical current density at several Josephson junctions as a function of a magnetic field surrounding the converter portion.

Suppose here that a predetermined current $I_o$ that is smaller than the value of critical current for Josephson junction $J_1$: having a minimum value of critical current is applied to the assembly of superconducting members through terminals $P_1$ and $P_0$. If, under this condition, an analog signal is applied to the assembly, it is superimposed on the input current and, as is apparent from FIG. 3, the superconducting state of a certain junctions $J_i$ to $J_{i-1}$ that have lower values of critical current than $J_i$ are upset to produce an electric resistance across each of these junctions. As a result, a DC voltage develops between detection terminals $P_2$ and $P_1$. Alternatively, a magnetic field $H_m$ of a certain strength may be applied to the assembly of superconducting members. The applied magnetic field is superimposed on the input current and, as is apparent from FIG. 3, the superconducting state of junction $J_i$ and junctions $J_1$ to $J_{i-1}$ which have lower values of critical current than $J_i$ is also upset to produce an electric resistance across each of these junctions. In this case, too, a DC voltage develops between detection terminals $P_2$ and $P_1$.

Figure 4:
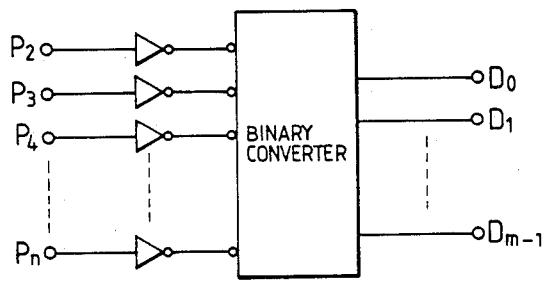
FIG. 4 shows diagrammatically a composition in which an encoder to the converter portion shown in FIG. 1.

The voltage that is produced from each of the detection terminals $P_2$, $P_3$, $P_n$ in response to the change in the input current or surrounding magnetic field may be applied to an encoder coupled in the manner shown in FIG. 4. The encoder will output a digital signal such as a binary signal.

Figure 5:
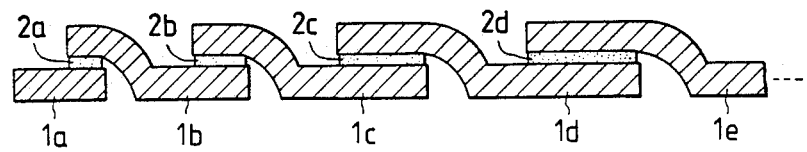
FIG. 5 is a cross-sectional view of a circuit in which the analog-to-digital converter shown in FIG. 1 is fabricated from an assembly of Josephson junctions.

FIG. 5 is a cross section of a circuit in the analog-to-digital converter shown in FIG. 1 which is fabricated from an assembly of Josephson junctions. In order to fabricate the circuit shown in FIG. 5, the superconductor 1a which is situated at the far left in the drawing formed first. Then, oxide film 2a is formed. After forming oxide film 2a, the second superconductor layer 1b is formed. These three steps complete the formation of one Josephson junction. The necessary Josephson junctions can be formed by repeating the set of steps according to the number of Josephson junctions to be formed.

Figure 6:
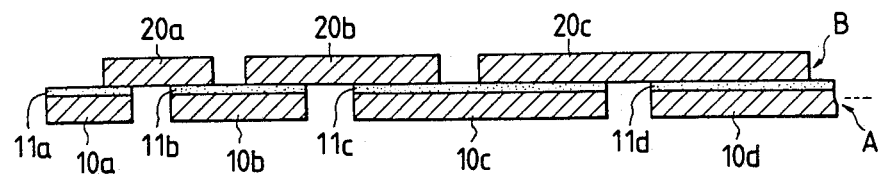
FIG. 6 is a cross-sectional view of another circuit in which the analog-to-digital converter shown in FIG. 1 is fabricated from an assembly of Josephson junctions.

FIG. 6 is a cross section of another circuit in which the analog-to-digital converter shown in FIG. 1 is fabricated from an assembly of Josephson junctions. As shown, the first superconductor layer A includes isolated superconductor films 10a, 10b, ... 10i, ... whose surface area (expressed by their length in FIG. 6, which is a cross-section view) increases stepwise in the leftward direction. The top surface of the first superconductor layer A is oxidized to form thin insulator films 11a, 11b, ... 11i that will serve as barrier layers for Josephson junctions.

The first layer A is overlaid with the second superconductor layer B which is also made of a patterned superconducting material Isolated superconductor films 20a, 20b, ... 20i ... are so patterned that each of them bridges two adjacent films in the first superconductor layer A. Stated more specifically, the superconductor film 20a bridges the superconductor films 10a and 10b, the film 20b bridges the films 10b and 10c, and so on until the necessary number of Josephson junctions are formed. To define the circuit of FIG. 6 in general terms, the first superconductor layer is composed of a plurality of isolated superconductor films that are situated in a predetermined common plane and whose top surfaces are covered with a thin insulator layer, and the second superconductor layer is composed of a plurality of superconductor films that are separated in such a way that each of them bridges two adjacent regions of the first superconductor layer. This assembly of Josephson junctions can be fabricated by performing just two patterning processes.

The superconductor films 10a, 10b, 10i, and 20a, 20b, ... 20i, ... can be formed by known thin-film patterning techniques, so a detailed explanation of the procedures for forming these films will not be provided.

In the converter portion shown in FIG. 6, a Josephson junction is formed between superconductor films 10a and 20a, between superconductor films 20a and 10b, and between all other regions of the first and second superconductor layers in superposition via an insulator layer. By increasing or decreasing the area of each junction stepwise, a circuit equivalent to the assembly of Josephson junctions shown in FIG. 5 can be formed.

The assembly of Josephson junctions forming the converter portion of the analog-to-digital converter of the present invention can be fabricated by a minimum number of steps using no more than two kinds of masks.

In the embodiments shown in FIG. 5 and 6, an assembly of superconducting current channels is formed of a plurality of series-connected Josephson junctions having varying areas of junction. If desired, a similar assembly may be formed by superimposing superconductor layers having different cross-sectional areas or different values of a certain critical condition. Alternatively, two or three of these methods may be combined in an appropriate way and this is of course included within the scope of the present invention.

As described on the foregoing pages, the analog-to-digital converter of the present invention receives as an input either a current or a magnetic field in which an analog signal is superimposed, and it outputs a digital signal in response to the change in the input current or magnetic field that results from the superposition of the analog signal. The conversion to a digital signal is direct and this is a notable advantage of the present invention since there has never been an analog-to-digital converter in the art that is capable of directly outputting a digital signal in response to a change in applied an magnetic field. Therefore, the analog-to-digital converter of the present invention has the potential to be used as a fast operating and highly sensitive magnetic sensor that is capable of direct outputting of a digital signal.

As a further advantage, the operating speed of the analog-to-digital converter can be significantly increased by having its converter portion formed from an assembly of Josephson junctions.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

I claim:
1. An analog-to-digital converter, comprising:
   a converter portion including a plurality of series-connected superconducting current channels for which different values of a certain critical condition are set, said critical condition being one of a critical current and a critical magnetic field, an analog signal being superimposed thereon, said values differing from one another by a fixed amount, and
   a detector portion including means for detecting the interruption of the flow of a superconducting current in each of said superconducting current channels, said analog-to-digital converter outputting a digital signal in response to an associated change in the critical current or the magnetic field that results from the superposition of the analog signal, said critical condition being applied as an input to said converter portion.

2. An analog-to-digital converter according to claim 1 wherein said superconducting current channels comprise Josephson junctions.

3. An analog-to-digital converter according to claim 1 wherein said means for detecting the interruption of the flow of a superconducting current is an assembly of circuits for detecting the voltages that develop in current channels in predetermined sections including said superconducting current channels.

4. An analog-to-digital converter according to claim 1 wherein the output of said means for detecting the interruption of the flow of a superconducting current is coupled to a circuit for generating a binary signal in accordance with the operation of said superconducting current channels.

5. An analog-to-digital converter according to claim 1 wherein said superconducting current channels comprise superconducting thin films formed on a substrate.

6. An analog-to-digital converter according to claim 5 wherein said superconducting thin films comprise physical vapor deposited films.

7. An analog-to-digital converter according to claim 5 wherein said superconducting thin films comprise composite oxide films that are formed by sintering deposited layers formed on said substrate by a wet coating process.

8. An analog-to-digital converter according to claim 5 wherein said substrate is single-crystal $SrTiO_3$, single-crystal MgO or sapphire.

9. An analog-to-digital converter according to claim 1 wherein said superconducting current channels comprise a material that is an electric conductor when it is in the non-superconducting state.

10. An analog-to-digital converter according to claim 1 wherein said superconducting current channels are formed of a composite oxide superconducting material represented by the following general formula:

$$(\alpha 1-x \beta x)\gamma y \delta z$$

where $\alpha$ denotes an element of Group IIa of the periodic table; $\beta$ denotes an element of Group IIIa of the periodic table; $\gamma$ denotes an element of Group Ib, IIb, IIIb, IVa or VIIIa of the period table; $\delta$ denotes oxygen; and x, y and z satisfy the relations: x=0.1-0.9, y=1.0-4.0, and $1 \leq z \leq 5$.

11. An analog-to-digital converter according to claim 10 wherein said composite oxide superconducting material has a crystallographic structure of the perovskite type.

12. An analog-to-digital converter according to claim 10 wherein element $\alpha$ is Ba, element $\beta$ is Y and element $\gamma$ is Cu.

13. An analog-to digital converter according to claim 10 wherein element $\alpha$ is Ba, element $\beta$ is La and element $\gamma$ is Cu.

14. An analog-to-digital converter according to claim 10 wherein element $\alpha$ is Sr, element $\beta$ is La and element $\gamma$ is Cu.

15. An analog-to-digital converter according to claim 2, wherein said Josephson junctions consist of the first superconductor layer which is composed of a plurality of isolated superconductor films that are situated in a predetermined common plane and whose top surfaces are covered with a thin insulator layer, and the second superconductor layer which is composed of a plurality of superconductor films that are isolated from one another in such a way that each of them bridges two adjacent films in said first superconductor layer, the superconductor films in said first layer and those in said second layer form junctions of different areas.

* * * * *